United States Patent [19]
Kuwako

[11] Patent Number: 6,107,003
[45] Date of Patent: Aug. 22, 2000

[54] METHOD FOR PRODUCING MULTI-LAYER PRINTED WIRING BOARDS HAVING BLIND VIAS

[75] Inventor: Fujio Kuwako, Urawa, Japan

[73] Assignee: Mitsui Mining & Smelting Co., Ltd., Tokyo, Japan

[21] Appl. No.: 09/229,225

[22] Filed: Jan. 12, 1999

[30] Foreign Application Priority Data

Jan. 14, 1998 [JP] Japan .................................. 10-017784

[51] Int. Cl.$^7$ ...................................................... G03C 5/00
[52] U.S. Cl. .......................................... 430/314; 430/318
[58] Field of Search .................................... 430/313, 314, 430/315, 318, 945; 216/65; 427/96, 97

[56] References Cited

U.S. PATENT DOCUMENTS

| | | | |
|---|---|---|---|
| 5,021,120 | 6/1991 | Buck et al. | 430/318 |
| 5,403,672 | 4/1995 | Urasaki et al. | 428/607 |
| 5,578,696 | 11/1996 | Mochizuki et al. | 528/353 |
| 5,759,416 | 6/1998 | Bosman et al. | 216/65 |

FOREIGN PATENT DOCUMENTS

| | | |
|---|---|---|
| 4-3676 | 1/1992 | Japan . |
| WO 97/41713 | 11/1997 | WIPO . |

OTHER PUBLICATIONS

Kestenbaum, Ami, et al., "Laser Drilling Of Microvias In Epoxy–Glass Printed Circuit Boards," *IEEE Transactions On Components, Hybrids, And Manufacturing Technology*, vol. 13, No. 4, pp. 1055–1062 (Dec. 1990).

Pargellis, A. N., et al., "Formation Of Microvias In Epoxy–Glass Composites By Laser Ablation," *Optics & Laser Technology*, vol. 22, No. 3, pp. 205–207 (Jun. 1990).

"A Flexible Production Laser System for Blind Via Drilling," Anton Kitai and Jim Morrison, Lumonics, Kanata, Ontario Canada; from brochure *Proceedings of the Technical Conference Expo '98*, 4 pgs.; 1998.

"CO2 Laser Drilling Technology for Glass Fabrics Base Copper Clad Laminate," Morio, Gaku, Hidenori Kimbara, Nobuyuki Ikeguchi, Yoshihiro Kato, Mitsubishi Gas Chemical Company, Inc., Tokyo, Japan; from brochure *Proceedings of the Technical Conference Expo '98*, 4 pgs; 1998.

*Primary Examiner*—S. Rosasco
*Attorney, Agent, or Firm*—Jenkens & Gilchrist

[57] ABSTRACT

An alkaline refractory metal which is insoluble in alkaline etching solutions, is electrodeposited on the surface of copper foil, then a thermosetting resin is applied to the surface and semi-cured to obtain a coated copper foil. The coated copper foil is bonded to one or both faces of an inner layer board having wirings on one or both of its faces. Then, the copper foil on a surface of this laminate is removed by alkaline etching, while selectively leaving the alkaline refractory metal layer. A laser beam is used to form via holes in both the alkaline refractory metal layer and the thermosetting resin layer simultaneously. With the above method, via holes of the multi-layered printed wiring board can be easily formed using a laser, and adhesion between the outer wirings made from the plated copper and the insulating resin is improved.

9 Claims, 2 Drawing Sheets

METHOD FOR PRODUCING MULTI-LAYER PRINTED WIRING BOARDS HAVING BLIND VIAS

FIELD OF THE INVENTION

The present invention relates to a method of making multi-layer printed wiring boards, more particularly, to a method wherein blind via holes are formed in the multi-layer printed wiring board using a laser, while improving the adhesion between an outer wiring made from copper layers and an insulating resin (a thermosetting resin layer).

BACKGROUND OF THE INVENTION

As electronic equipment becomes smaller and lighter, it is necessary to reduce the width of wiring lines and the diameter of the via holes which connect layers in multi-layer printed wiring boards. It is very difficult to use mechanical drilling to form holes below about 200 μm diameter in an industrial scale, and lasers have been used to make such small holes.

A carbon dioxide laser can form holes at high speed in organic substances, such as epoxy resin and polyimide resin. Such lasers have been widely used in making printed wiring boards. Forming holes in copper foil is difficult, however, because the copper foil reflects the laser beam. To solve this problem, as disclosed in Japanese Patent Publication No. 4-3676, a hole is etched through the copper foil having the same diameter as a via hole. Then, the laser beam is used to form the hole through the organic substrate, with the beam diameter being larger than that of the via hole. When such a process is used, additional plating must be applied to the copper foil as well as in the via holes. Consequently, the thickness of the outer layer of copper layer is the sum of the thickness of the copper foil itself and the thickness of the plated copper, and it is not easy to form fine pitch wiring lines. Furthermore, it is not easy to etch a hole in an outer wiring with the hole aligned with an inner pad, because highly accurate alignment is required.

In another process, the faces of an inner layer board which have wiring patterns are coated with an insulating resin, holes are formed in the resin by the laser beam, and then the resin surfaces are directly plated with copper to form an outer copper wiring. Only a single layer of copper is deposited. In this process, however, it is necessary to roughen the insulating resin surfaces to obtain acceptable adhesion strength between the plated copper and the insulating resin. Roughening of the insulating resin surfaces often cannot provide sufficient adhesion strength between the copper layer and the insulating resin.

SUMMARY OF THE INVENTION

The present invention solves the above problems of the prior art, and provides a process for making multi-layer printed wiring boards. Via holes are easily formed with a laser, and adhesion between the conductors (outer wirings) made by the plated copper layers and the insulating resin is improved.

The problems are solved by electroplating (electrodepositing) an alkaline refractory metal (an alkali resistance metal) which is soluble in an acid alkaline etching solution, but not soluble in an alkaline etching solution, on 1) a shiny surface, 2) a matted surface, 3) a roughened shiny surface or 4) a roughened matted surface of a copper foil. Therefore, the alkaline refractory metal is not dissolved in an alkaline etching solution. The alkaline refractory metal, however, should be dissolved in an acid etching solution.

In one aspect, the invention provides a method of making multi-layer printed wiring boards in which an alkaline refractory metal is electrodeposited on the surface of copper foil. Then, a thermosetting resin is applied on the surface and heated to a semi-cured state (B-stage) to obtain a resin-coated copper foil. The coated copper foil is bonded (laminated) to one or both of the faces of an inner layer board, which has wiring patterns on one or both of the faces, using the resin coated side of the coated copper foil as a bonding layer. After laminating the coated copper foil to the inner layer board, the copper foil on the outer surface is removed by alkaline etching, leaving the alkaline refractory metal layer, which is not dissolved. A laser beam is used to form a hole in both the alkaline refractory metal layer and the thermosetting resin layer simultaneously. Then, copper is plated on the alkaline refractory metal layer and the blind via holes including a resin surface of the holes by a conventional process to form the outer wirings connected with the inner wirings.

In another aspect, the invention is a multi-layer printed wiring board made by the method described above.

With the above method, it is possible to easily form via holes in the multi-layer board with a laser, and to improve adhesion between the outer wirings made from the plated copper and the insulating resin, compared with conventional processes.

Other features and advantages of the invention will become apparent from the following description of a preferred embodiment taken in conjunction with the accompanying drawings.

BRIEF DESCRIPTION OF THE DRAWINGS

The FIG. 1 shows steps (a)~(f) of a panel plating process for making a multi-layer printed wiring board according to the invention.

The FIG. 2 shows another steps (a)~(g) of a pattern plating process (semi-additive process) for making a multi-layer printed wiring board according to the invention.

DESCRIPTION OF ILLUSTRATIVE EMBODIMENTS

Although both electrodeposited copper foil and rolled copper foil can be used as copper foil for the present invention, a process using an electrodeposited copper foil will be described below.

Figure 1:
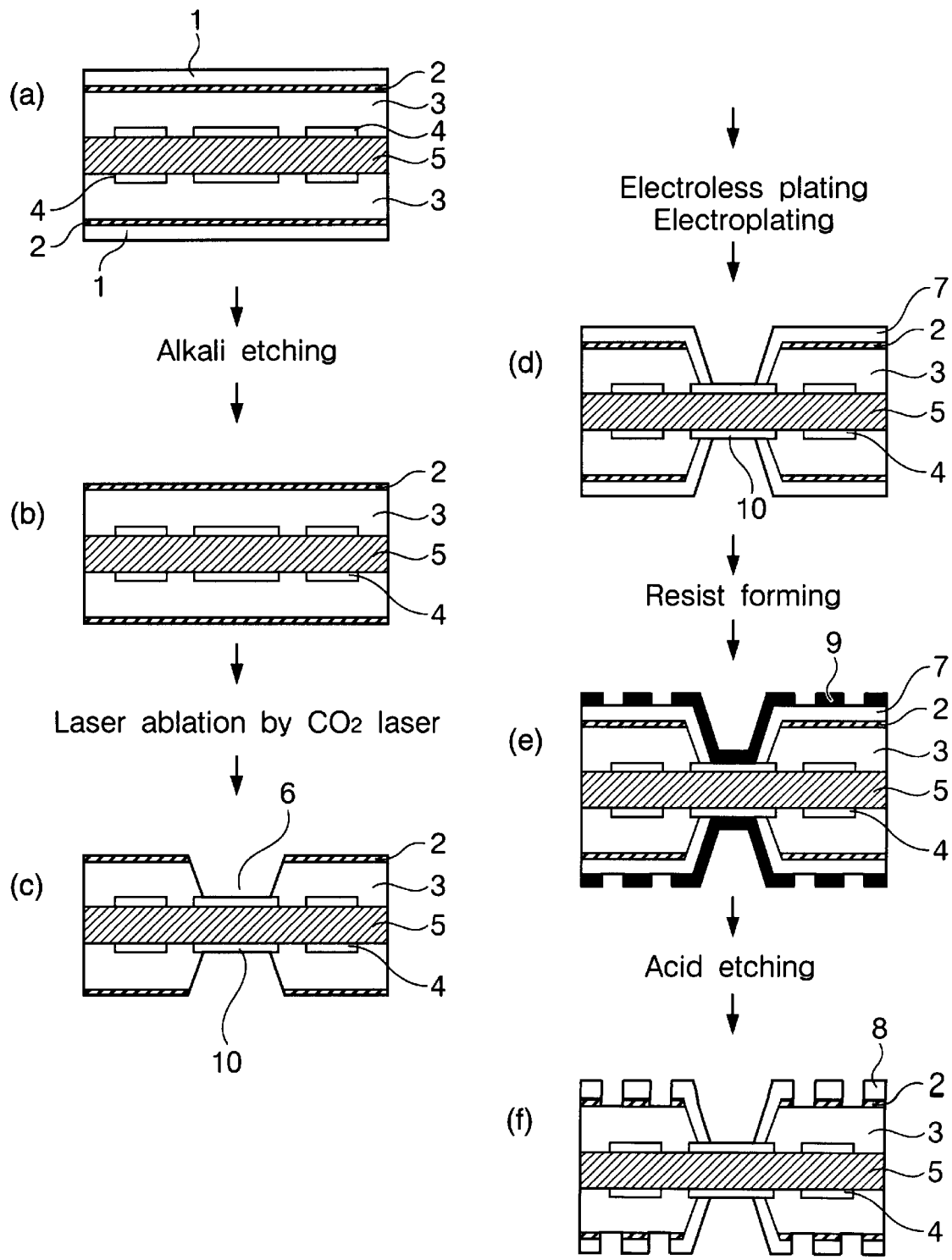
Figure 2:
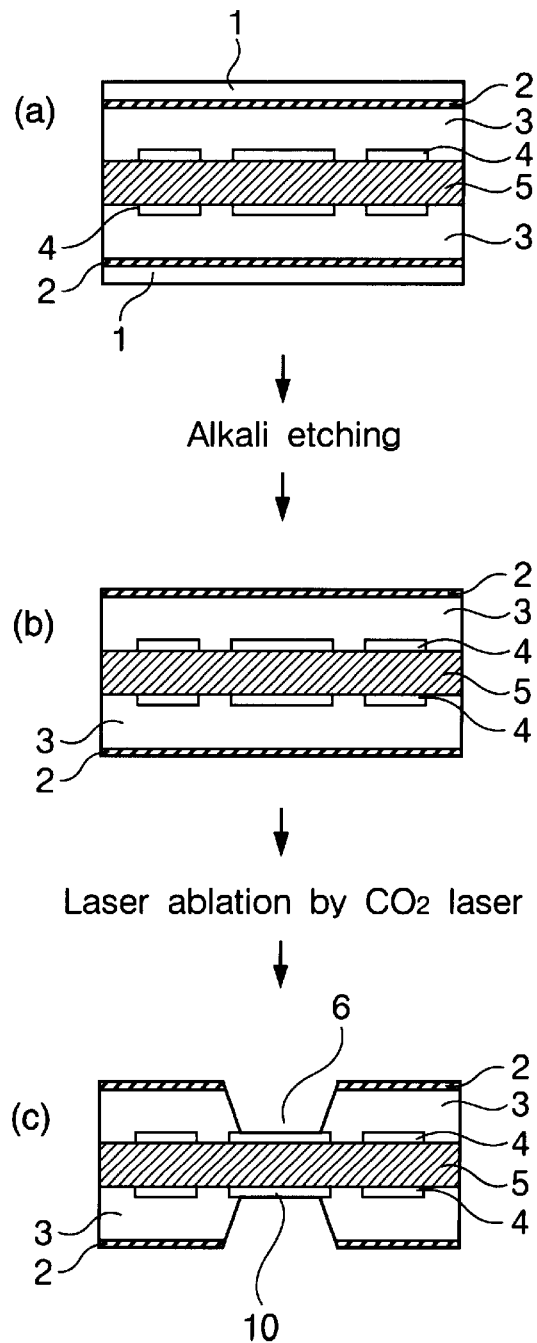
Figure 2:
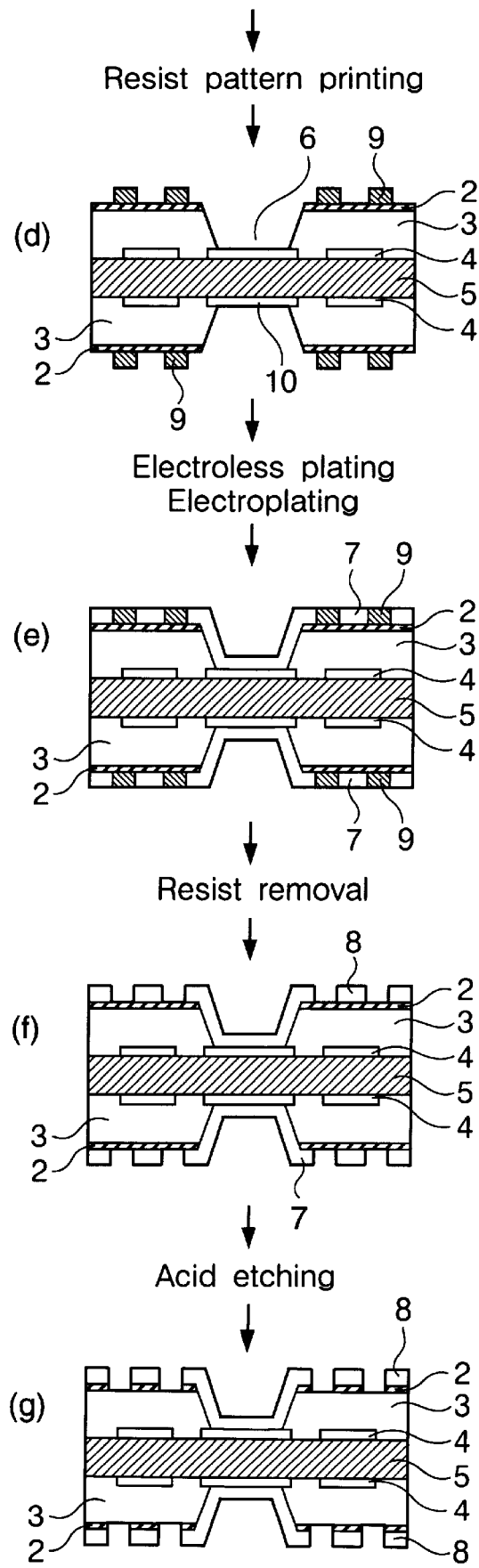

In the process shown in the FIGS. 1 and 2, a multi-layer wiring board is made. These FIGS. 1~2 show copper foils 1, alkaline refractory metals (alkali resistance metals) 2, thermosetting insulating resin layers 3, two inner wirings (circuits) 4, inner resin layers 5, via holes 6, two outer copper layers 7, two outer wirings (circuits) 8, etching resist pattern 9 and pad 10 connected with the outer wirings.

In one process to produce a multi-layer printed wiring board of the present invention, an alkaline refractory metal 2 is electrodeposited on the surface of copper foil 1. The degree of roughness (R) of the surface of the copper foil on which the alkaline refractory metal is plated is preferably in the range of about 0.5–15 μm, more preferably 2.5–15 μm. An $R_z$ less than 0.5 μm is not desirable, because the adhesion between the alkaline refractory metal 2 and the copper foil 1 is not sufficient. An $R_z$ larger than 15 μm is not desirable, because a longer time is required for etching the copper, and undercutting of the wirings formed from the plated copper is likely occurred.

In one example, the copper foil is roughened by electrodepositing copper on foil 1, from a cupric sulfate bath containing 10–20 g/L of copper and 30–100 g/L of sulfuric acid, using the copper foil as a cathode for 5–20 seconds with a current density of 30–50 A/dm$^2$ in a temperature of 20–40° C.

Thickness of the copper foil 1 is preferably in a range of 5–100 μm. If the copper foil is thicker than 100 μm, etching of the copper foil takes too much time, which reduces manufacturing efficiency. If thickness of the copper foil is less than 5 μm, on the other hand, it is difficult to produce the foil itself and handle it.

Next, alkaline refractory metal 2, which can be dissolved in an acid etching solution, but which is insoluble in a certain alkaline pH range is electrodeposited on the surface of the copper foil 1. Various metals which are alkaline refractory and can be dissolved in acid may be used, such as tin, nickel, cobalt, or alloys, such as tin and zinc, zinc and nickel, or tin and copper, can be used. It is preferred to use an alkaline refractory metal chosen from the group comprising tin, zinc and tin alloy, zinc and nickel alloy, and tin and copper alloy, and it is most preferred to use tin or an alloy of tin and zinc having alkali resistance to etching by alkaline etchants. The alkaline refractory metal layer 2 may be deposited from a bath, such as shown in Table 1, where tin is deposited, using the copper foil as a cathode.

TABLE 1

| Composition | Concentration |
| --- | --- |
| Stannous Sulfate | 20–30 g/l |
| Sulfuric Acid | 70–90 g/l |
| Cresolsulfonic Acid | 60–80 g/l |
| Gelatin | 2–3 g/l |
| Beta Naphthol | 1–2 g/l |
| Current Densit | 5–10 A/dm$^2$ |
| Temperature | 20–30° C. |

The thickness of the alkaline refractory metal layer 2 is preferably in a range of 0.005–3.0 μm. If the alkaline refractory metal layer 2 is thinner than 0.005 μm, adhesion between the alkaline refractory metal layer 2 and the thermosetting resin layer 3 is poor, and sufficient adhesion cannot be obtained between the thermosetting resin layer 3 and the outer plated copper layer 7 which is formed on the alkaline refractory metal layer 2 as shown in FIG. 1 at (d). If the alkaline refractory metal layer 2 is thicker than 3.0 μm, it is difficult to form holes through it with a carbon dioxide laser.

To increase adhesive strength between the thermosetting resin 3 and the outer plated copper layer 7, applying a chromating treatment onto the alkaline refractory metal layer 2, followed by a silane coupling treatment is effective. Further, a passivation by applying zinc, tin, nickel, chromate, imidazole, aminotriazole, benzotriazole, or the like, onto the outer face of the copper foil 1, that is, the surface of the copper foil 1 on which the alkaline refractory metal is not formed may be carried out.

A thermosetting resin varnish is applied on a surface of the alkaline refractory metal layer 2 to form the thermosetting resin layer 3. Then, the thermosetting resin 3 is heated and dried at a temperature of 140–150° C. for 5–20 minutes to a semi-cured state (B-stage) to prepare a copper foil coated with B-stage resin. As the thermosetting resin 3, epoxy resin (for example, Epicoate 1001, produced by Yuka Shell Co., Ltd.) and the like, can be used. More specifically, the thermosetting resin 3 may be formed on the surface of the alkaline refractory metal layers by applying the thermosetting resin varnish. The varnish comprises the epoxy resin, dicyandiamide as a hardener, a hardening accelerator (for example, 2E4MZ, produced by Shikoku Kasei Co., Ltd.), and methyl ethyl ketone as a solvent. Alternatively, as the thermosetting resin layer, prepreg impregnated thermosetting resins into a fiber matrix, such as glass cloth, aramide paper, or the like, or a thermosetting resin film can be used. The thickness of the thermosetting resin 3 is preferably in a range of 20–200 μm. If the thermosetting resin 3 is thinner than 20 μm, sufficient interlayer insulation and adhesion strength cannot be obtained. If the thermosetting resin is thicker than 200 μm, it is difficult to form via holes with small diameters.

The face of the resin side of the coated copper foil is bonded to one or both of the opposite faces of an inner resin layer 5 which has inner wirings 4, then laminated by heating and pressing at a temperature of about 150–200° C. and at a pressure of about 30 kgf/cm$^2$. A multi-layer board having two embedded inner wirings 4 is formed as shown in the FIG. 1 at (a).

Next, the copper foil is removed from the multi-layer board of (a) by alkaline etching, selectively leaving the alkaline refractory metal layer, as shown in the FIG. 1 at (b). This alkaline etching may be carried out, for example, using a solution including 200–250 g/L of NH$_4$OH, 130–160 g/L of NH$_4$Cl, and 150–160 g/L of Cu at a temperature of 40–50° C. Since the surface of the copper foil has a surface roughness of 0.5–15 μm, preferably 2.5–15 μm, removing the copper foil 1 leaves many projections and depressions on the surface of the alkaline refractory metal 2, which allow the laser beam to be easily absorbed into the surface of the alkaline refractory metal 2, and facilitates forming of holes with the laser.

The via holes 6 are formed in both the alkaline refractory metal layer 2 and the resin layer 3 simultaneously by irradiating with the laser beam the multi-layer board of (b), as shown in the FIG. 1 at (c) to form a multi-layer board (e) in which via holes are already formed. A carbon dioxide laser is preferably used, but the invention is not especially limited to this laser. A desmearing treatment can be applied, if necessary, after forming holes by irradiating with the laser beam.

After making the via holes 6, a layer of copper is deposited on the multi-layer board (e), namely on the alkaline refractory metal 2 and blind via holes 6 including a resin surface of the holes 6 and pad 10 first by electroless plating, followed by electroplating. A copper pyrophosphate plating solution (for example, OPC-750 electroless copper plating solution, produced by Okuno Seiyaku Co., Ltd.), at a solution temperature of 20–25° C., for 15–20 minutes, can be used to provide a layer of electroless copper having a thickness of approximately 0.1 μm. Thereafter, an electroplating solution including 30–100 g/L of copper and 50–200 g/L of sulfuric acid at a temperature of 30–80° C. with a cathode current density of 10–100 A/dm$^2$, can be used to provide an outer plated copper layer 7 having a thickness of 5–35 μm, as shown in the FIG. 1 at (d). The outer plated copper layer 7 is electroplated on the electroless copper layer which is formed on both the surface of the alkaline refractory metal 2 and via holes 6 including the resin surface of the holes 6, to which the shape of the surface of the copper foil has been transferred. The alkaline refractory metal 2 has a strong bond strength with the resin layer 3. Further, the electroless copper layer provides strong bond strength between the outer plated copper layer 7 and the alkaline refractory metal layer 2, i.e., the adhesion strength is higher than the case where the outer copper layer 7 is electroplated directly to the resin layer 3.

In a typical process, a photoresist (for example, Microposit 2400, produced by Shiplay Co., Ltd.) is applied on the surface of the outer plated copper layer 7 to a thickness of approximately 7 μm and dried. Then, the photoresist is exposed to radiation through a photomask having a predetermined wiring pattern 9. After radiating, the photoresist is developed using 10% KOH solution to expose copper, which is then acid etched, using a solution including 100 g/L of $CuCl_2$ and 100 g/L of free hydrochloric acid at a temperature of 50° C. to dissolve the alkaline refractory metal 2 and a part of the outer copper layer thereby forming the outer wirings 8, as shown in the Figure at (e). The alkaline refractory metal layer 2 is much thinner than the thickness of the outer copper layer 7 and is easily removed by an acid etching.

Finally, the photoresist coated on the outer wirings 8 is removed at a temperature of 50° C. using 3% NaOH solution to obtain a multi-layer printed wiring board as shown in FIG. 1 at (f).

The thickness of the alkaline refractory metal 2 (usually having 3μm or less) is much thinner than the thickness of the outer copper foil 1 (typically having 18 μm). Therefore, a total thickness of the copper layer used to form the outer wirings in the present invention is much thinner (by more than 15 μm) than that used in the typical process.

As another process, a semi-additive process or a pattern plating process as shown in FIG. 2 at (a)–(g), the multi-layer boards (e) in which via holes are already formed as shown in FIG. 2 at (c), preparing as shown in FIG. 2 at (a)–(c), is coated with photoresist and exposed through a photomask, followed by developing to form the photoresist patterns 9 shown in FIG. 2 at (d). This exposes the alkaline refractory metal 2 at positions corresponding to the outer wirings and pads. The wiring patterns (circuit patterns) 8 are made by electroless plating, followed by electroplating, as discussed above, which is shown in FIG. 2 at (e). When the photoresist is removed after the electroplating steps as shown FIG. 2 at (f), the alkaline refractory metal 2 remains on the resin layer 3 between copper wirings 8 and must be removed, which is easily done by an acid etching. Then, a multi-layer printed wiring board is obtained as shown in FIG. 2 at (g).

In the present invention, since the alkaline refractory metal layer 2 is very thin compared with the outer wirings 8, it is possible to remove the alkaline refractory metal layer 2 without protecting the copper wiring by tin plating, since only a short time is required when using an acid etching solution, such as cupric chloride or ferric chloride. The undercutting of the wiring is reduced, and the accuracy of the wiring patterns is improved.

The present invention may also be applied to multi-layer board having three or more layers. Furthermore, a layer having via holes formed by the laser as described above may be multi-layered by repeating the steps of lamination, forming holes by laser, plating, and patterning. Therefore, the present invention can be applied to production of multi-layer printed wiring boards having any number of layers.

The present invention will be explained more specifically using examples and comparative examples.

EXAMPLE 1

A roughening treatment was applied to the shiny face (i.e., smooth side) of an electrodeposited copper foil having a nominal thickness of 18 μm, a roughness (Rz) of 1.9 μm, and a matte face (i.e., rough side) roughness (Rz) of 5 μm. Copper was electrodeposited on the shiny face for 5 seconds with a current density of 30 $A/dm^2$, using the copper foil as a cathode from a cupric sulfate solution having a temperature of 40° C. and including 10 g/L of copper and 100 g/L of sulfuric acid. The roughness (Rz) of the surface after the roughening treatment was applied was 2.9 μm.

Tin was electrodeposited from a bath having the composition shown in Table 2, at a temperature of 20° C., on the copper foil to which the roughening treatment had been applied. The amount of tin deposited on the treated surface was 1.2 $g/m^2$ (approximately 0.2 μm).

TABLE 2

| Tin Plating Bath Composition | Concentration |
| --- | --- |
| Stannous Sulfate | 25 g/l |
| Sulfuric Acid | 80 g/l |
| Cresolsulfonic Acid | 80 g/l |
| Gelatin | 2 g/l |
| Beta Naphthol | 1 g/l |

After rinsing with deionized water, an electrolytic chromate treatment was applied to the tin-plated surface for 5 seconds with a current density of 0.5 $A/dm^2$, using an electrolite including 2 g/L of chromic acid anhydride having a pH of 11.0 to obtain a chromate-treated copper foil.

An epoxy resin varnish was prepared by mixing 100 parts epoxy resin (Epicoat 1001, produced by Yuka Shell Co., Ltd.), 2.5 parts dicyandiamide as hardener, and 0.2 parts 2E4MZ (produced by Shikoku Kasei Co., Ltd.) as an accelerator in metylethyl ketone as a solvent. The epoxy resin varnish was applied on the surface of the chromate-treated copper foil, and heated for 10 minutes at a temperature of 130° C. to the semi-cured state, thereby obtaining a copper foil coated with the epoxy resin having a thickness of 75 μm.

A FR-4 inner layer board having wirings on both sides (R-1766, produced by Matsushita Denko Co., Ltd.) having a thickness of 0.5 mm was prepared. A black oxide treatment was applied to the inner layer board. The resin coated copper foil described above was bonded on both sides of the inner layer board so that the resin side of the copper foil was adjacent to the inner layer board. The inner layer board and resin-coated foil were laminated for 60 minutes at a temperature of 180° C. and a pressure of 20 $kg/cm^2$, using a vacuum press, to obtain a multi-layer wiring board having the inner wirings embedded in the resin.

The outer copper foils were etched from the multi-layer board using an etching solution including 200 g/L of $NH_4OH$, 130 g/L of $NH_4Cl$, and 150 g/L of Cu at a temperature of 50° C. The copper foil was removed, leaving the tin plating layer exposed.

Then, via holes of 100 μm diameter were formed on the multi-layer board from which the copper foil had been removed and the tin layers exposed. A carbon dioxide laser (with laser output of 60W) with a diameter of 100 μm was used to form holes in the tin plating and resin to reach the inner pad.

Electroless copper plating was applied to the tin layer and via holes including a resin surface of the via holes for 18 minutes at a temperature of 23° C. using OPC-750 electroless copper plating solution (produced by Okuno Seiyaku Co., Ltd.) to provide plating thickness of approximately 0.1 micron. Then, copper was electroplated on the plated electroless copper, using a solution including 100 g/L of copper and 150 g/L of sulfuric acid at a temperature of 25° C. with a cathode current density of 5 $A/cm^2$ to provide an outer copper layer having a thickness of 20 μm to prepare a multi-layer board.

Following a typical process, Mircoposite 2400 (produced by Shiplay Co., Ltd.), as a photoresist, was applied on the surface of the multi-layer board to a thickness of approximately 7 μm and dried. Then, photoresist was exposed to radiation using a photomask having a predetermined wiring pattern. After the exposure, the photoresist was developed using a 10% KOH solution to remove the uncured resist to form photoresist patterns. Acid etching of the exposed copper was carried out, using a solution including 100 g/L of $CuCl_2$ and 100 g/L of free hydrochloric acid at a temperature of 50° C. to form the outer wirings. Finally, the cured photoresist remaining on the outer faces of the outer wirings was removed using 5% NaOH solution at a temperature of 30° C. to obtain a multi-layer printed wiring board.

Then, the peel strength (kgf/cm) of the outer wiring from the printed wiring board was measured, following the procedure of JIS-C6481. The result is shown in Table 3.

Comparative Example 1

Using the methods of Example 1, the epoxy resin varnish was applied on the roughened surface of copper foil and heated for 10 minutes at a temperature of 130° C. to the semi-cured state, thereby obtaining a copper foil coated with resin having a thickness of 75 μm, except that 18 μm copper foil (3EC-III, produced by Mitsui Mining & Smelting Co., Ltd.) was used as the copper foil 1 and the alkaline refractory metal (i.e., tin) was not electroplated on it.

A FR-4 inner layer board having wirings on both sides having a thickness of 0.5 mm was prepared and a black oxide treatment was applied to the inner board. The resin coated copper foil was laminated on both sides of the inner layer board so that the resin face of the copper foil adjacent to the inner layer boards, again using the methods of Example 1. Then, carrying out the same steps described in Example 1, a multi-layer printed wiring board was obtained.

Then, the peel strength (kgf/cm) of the outer wirings from the printed wiring board was measured, following the procedure of JIS-C6481. The result is shown in Table 3.

Comparative Example 2

Using the same multi-layer board having the inner wirings embedded in the resin as in Comparative Example 1, guide holes, corresponding to the holes to be formed with the laser, were formed by etching at positions of the copper foil having the same diameter as the holes to be formed by the laser. The copper foil was not etched away. Then, using the procedures as in Example 1, a multi-layer printed wiring board was obtained.

Then, the peel strength (kgf/cm) of the outer copper wiring having a thickness of 38 mm from the printed wiring board was measured, following the procedure of JIS-C6481. The result is shown in Table 3.

TABLE 3

|  | Example 1 | Comparative Example 1 | Comparative Example 2 |
| --- | --- | --- | --- |
| Peel strength of outer copper wiring (kgf/cm) | 1.1 | 0.3 | 1.8 |
| Thickness of outer layer copper foil (μm) | 20 | 20 | 38 |
| Workable minimum pattern width (μm) | 50 | 50 | 100 |

As shown in Table 3, the peel strength between the resin and the outer wirings is increased in Example 1 by including the layer of alkaline refractory metal, compared with Comparative Example 1. Finer wirings can be formed by etching, compared with Comparative Example 2, where the outer wirings were thicker than in Example 1 and Comparative Example 1.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A method of making a multi-layer printed wiring board comprising
   (a) electrodepositing an alkaline refractory metal which can be dissolved in an acid etching solution on one surface of a copper foil;
   (b) applying a thermosetting resin on the electrodeposited alkaline refractory metal of (a) and curing said resin to a semi-cured state, thereby producing a coated copper foil;
   (c) bonding said coated copper foil of (b) to an inner layer board having inner wirings on one or both of the faces thereof, said thermosetting resin being laminated onto said inner layer board to form a multi-layer board;
   (d) removing said copper foil from the multi-layer board of step (c) by etching with an alkaline etching solution; thereby leaving said alkaline refractory metal exposed;
   (e) forming blind via holes in both the alkaline refractory metal and the thermosetting resin by directly irradiating said exposed alkaline refractory metal of (d) to remove the alkaline refractory metal and the thermosetting resin simultaneously with a $CO_2$ laser to form a multi-layer board in which via holes are formed; and
   (f) forming outer wirings.

2. A method according to claim 1, wherein the outer wirings are formed by first electroless depositing copper and thereafter electrodepositing a copper layer on the multi-layer board of step (e) in which blind via holes are already formed, applying a photoresist on the copper layer and thereafter forming photoresist patterns, acid etching a part of the outer copper layer and the alkaline refractory metal, and removing the photoresist patters.

3. A method according to claim 1, wherein the outer wirings are formed by applying a photoresist on the multi-layer board of step (e) in which blind via holes are already formed and thereafter forming photoresist patters, depositing copper wiring patterns with electroless and electrodeposition between the photoresist patterns, removing the photoresist patterns, and removing the alkaline refractory metal remaining between the photoresist patterns by acid etching.

4. A method according to claim 1, wherein said copper foil has a roughness (Rz) in the range of 0.5–15 μm on the face on which said alkaline refractory metal is electrodeposited.

5. A method according to claim 1, wherein the thickness of said copper foil is in a range of about 5–100 μm, and the thickness of the alkaline refractory metal layer is in a range of about 0.005–3.0 μm.

6. A method according to claim 1, wherein said alkaline refractory metal is selected from the group consisting of tin, zinc, and tin alloy, zinc and nickel alloy, and tin and copper alloy.

7. A method according to claim 1, wherein said copper foil of step (a) is electrodeposited copper foil or rolled copper foil.

8. A method according to claim 1, wherein a chromate layer is further provided on said alkaline refractory metal layer.

9. A method according to claim 1, wherein said thermosetting resin layer is a prepreg or a thermosetting resin film.

* * * * *